US012593585B2

(12) United States Patent
Lin

(10) Patent No.: US 12,593,585 B2
(45) Date of Patent: Mar. 31, 2026

(54) PIXEL ARRAY, DISPLAY PANEL AND METAL MASK

(71) Applicant: Everdisplay Optronics (Shanghai) Co., Ltd., Shanghai (CN)

(72) Inventor: Hsin Chih Lin, Shanghai (CN)

(73) Assignee: Everdisplay Optronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/042,604

(22) PCT Filed: Aug. 10, 2022

(86) PCT No.: PCT/CN2022/111462
§ 371 (c)(1),
(2) Date: Feb. 23, 2023

(87) PCT Pub. No.: WO2023/236344
PCT Pub. Date: Dec. 14, 2023

(65) Prior Publication Data
US 2025/0098466 A1 Mar. 20, 2025

(30) Foreign Application Priority Data
Jun. 6, 2022 (CN) .......................... 202210631457.7

(51) Int. Cl.
*H10K 59/35* (2023.01)
*H10K 71/16* (2023.01)

(52) U.S. Cl.
CPC ......... *H10K 59/352* (2023.02); *H10K 59/351* (2023.02); *H10K 59/353* (2023.02); *H10K 71/166* (2023.02)

(58) Field of Classification Search
CPC .. H10K 59/352; H10K 59/351; H10K 59/353; H10K 71/166
See application file for complete search history.

(56) References Cited

U.S. PATENT DOCUMENTS

2008/0224968 A1* 9/2008 Kashiwabara ....... G09G 3/3225
                                                        345/83
2017/0278905 A1 9/2017 Hsu et al.
                        (Continued)

FOREIGN PATENT DOCUMENTS

CN      104465714 A    3/2015
CN      108364983 A    8/2018
            (Continued)

OTHER PUBLICATIONS

International Search Report dated Dec. 28, 2022 of International Application No. PCT/CN2022/111462.

*Primary Examiner* — Tracie Y Green
(74) *Attorney, Agent, or Firm* — Qinghong Xu

(57) ABSTRACT

The present disclosure relates to the field of display technology and provides a pixel array, a display panel and a metal mask. The pixel array includes a plurality of pixel units, and each pixel unit is composed of two red sub-pixels, two blue sub-pixels and a green sub-pixel. In each pixel unit, connection lines of centers of the red sub-pixels and the blue sub-pixels in a same row and a same column form a parallelogram, the two red sub-pixels and the two blue sub-pixels are located at diagonal positions of the parallelogram respectively, and a center of the green sub-pixel is located at an intersection position of diagonal lines of the parallelogram. Along the row direction, two adjacent parallelograms are in a translational relationship and share a column side. Along the column direction, two adjacent parallelograms are in a mirror-image relationship and share a row side.

18 Claims, 5 Drawing Sheets

(56)                    References Cited

U.S. PATENT DOCUMENTS

| | | | | |
|---|---|---|---|---|
| 2022/0310711 A1* | 9/2022 | Liu | ...................... | H10K 59/122 |
| 2023/0084896 A1* | 3/2023 | Zhang | .................. | H10K 59/353 |
| | | | | 257/89 |
| 2023/0337498 A1* | 10/2023 | Yang | ................... | H10K 59/131 |
| 2024/0265860 A1* | 8/2024 | Sang | ................... | G09G 3/3216 |

FOREIGN PATENT DOCUMENTS

| | | |
|---|---|---|
| CN | 110416267 A | 11/2019 |
| CN | 110767733 A | 2/2020 |
| CN | 110867481 A | 3/2020 |
| CN | 112864215 A | 5/2021 |
| CN | 113097267 A | 7/2021 |

* cited by examiner

400

PIXEL ARRAY, DISPLAY PANEL AND METAL MASK

CROSS-REFERENCE TO RELATED APPLICATION

This application is the 371 application of PCT Application No. PCT/CN2022/111462, filed Aug. 10, 2022, which is based upon and claims priority to Chinese Patent Application No. 202210631457.7, filed Jun. 6, 2022, the entire contents of which are incorporated herein by reference.

TECHNICAL FIELD

The present disclosure relates to the field of display technologies, in particular, to a pixel array, a display panel and a metal mask.

BACKGROUND

With the development of the display technology, high-resolution display is more and more widely used. The active matrix/organic light emitting diode (AMOLED) has the advantages of high image quality, high contrast, high color saturation and so on. It has gradually replaced the traditional display panel and become the mainstream of the new generation of small and medium-sized display screens.

AMOLED panels need to have a high resolution and maintain a high aperture ratio of pixel. Through sub-pixel rendering, that is, sharing sub-pixels of certain positions, the high resolution and the high aperture ratio of pixel can be achieved based on relatively few sub-pixels.

AMOLED panels use fine metal mask (FMM) to evaporate red, green and blue sub-pixels. With the increase of times of evaporation, organic materials will gradually accumulate at the edge of the opening of FMM. When the organic materials at the edge of the opening accumulate to a certain amount, the FMM needs to be cleaned offline and then put online again, otherwise the pixels will be lack of evaporation due to the opening being blocked.

The service life of FMM is directly related to the thickness of the evaporated film layer. Among the red, green and blue sub-pixels, the red sub-pixel has the largest film thickness, resulting in the shortest service life of the red light evaporation opening of FMM, which directly affects the service life of FMM.

If a size of the red light evaporation opening of FMM is increased, the spacing between the red light evaporation opening and the red sub-pixel can be increased when performing evaporation alignment, which delays the accumulation of organic materials at the edge of the red light evaporation opening. However, at the same time, a distance between the red light evaporation opening and the sub-pixels with other colors will be reduced, resulting in the reduction of the process margin between different colors, which not only increases the process difficulty, but also affects the product qualification rate.

SUMMARY

In view of this, the present disclosure provides a pixel array, a display panel and a metal mask, which can increase the spacing between a red sub-pixel and a red light evaporation opening of the metal mask when making the pixel array through a layout and arrangement of red, green and blue sub-pixels, so as to prolong the service life of the metal mask. At the same time, distances between the red light evaporation opening and the sub-pixels with other colors are maintained to achieve higher process margin, reduce the process difficulty and improve the qualification rate of product.

According to one aspect of the present disclosure, a pixel array is provided, including red sub-pixels, green sub-pixels and blue sub-pixels arranged in multiple rows and multiple columns. Along a row direction, the red sub-pixels and the blue sub-pixels are alternately arranged to form first type of pixel rows, the green sub-pixels are arranged to form second type of pixel rows, and the first type of pixel rows and the second type of pixel rows are alternately arranged along a column direction. Along the column direction, the red sub-pixels and the blue sub-pixels are alternately arranged to form first type of pixel columns, the green sub-pixels are arranged to form second type of pixel columns, and the first type of pixel columns and the second type of pixel columns are alternately arranged along the row direction. The pixel array includes a plurality of pixel units, each of which is composed of two red sub-pixels and two blue sub-pixels distributed in two adjacent first type of pixel rows and two adjacent first type of pixel columns, and one green sub-pixel located between two adjacent first type of pixel rows and two adjacent first type of pixel columns. In each of the pixel units, connection lines of centers of the red sub-pixels and the blue sub-pixels in a same row and a same column form a parallelogram, the two red sub-pixels and the two blue sub-pixels are respectively located at diagonal positions of the parallelogram, and a center of the green sub-pixel is located at an intersection position of diagonal lines of the parallelogram. Along the row direction, two adjacent parallelograms are in a translational relationship and share a column side. Along the column direction, two adjacent parallelograms are in a mirror-image relationship and share a row side.

In some embodiments, the green sub-pixel has a long side and a short side. In each of the pixel units, the short side of the green sub-pixel faces an acute angle of the parallelogram, and the long side of the green sub-pixel faces an obtuse angle of the parallelogram.

In some embodiments, in each of the pixel units, a red sub-pixel located at a position of the obtuse angle of the parallelogram is opposite to the long side of the green sub-pixel, and a red sub-pixel located at a position of the acute angle of the parallelogram is opposite to the short side of the green sub-pixel.

In some embodiments, a size of the blue sub-pixel is larger than a size of the red sub-pixel. In each of the pixel units, a distance RG1 between the red sub-pixel and the long side of the green sub-pixel, a distance RG2 between the red sub-pixel and the short side of the green sub-pixel, a distance BG1 between the blue sub-pixel and the short side of the green sub-pixel, and a distance BG2 between the blue sub-pixel and the long side of the green sub-pixel satisfy: RG1≈RG2>BG1≈BG2.

In some embodiments, the distance RG1 and the distance RG2 further satisfy: 20 μm≤RG1≈RG2≤30 μm, the distance BG1 and the distance BG2 further satisfy: 18 μm≤BG1≈BG2≤28 μm.

In some embodiments, a ratio GL/GW of the long side to the short side of the green sub-pixel satisfies: 1.25≤GL/GW≤1.85.

In some embodiments, the acute angle a of the parallelogram satisfies: 80°≤a<90°. The obtuse angle oa of the parallelogram satisfies: 90°<oa≤100°.

In some embodiments, a width of the parallelogram along the row direction is equal to a height of the parallelogram along the column direction.

In some embodiments, an aperture ratio RO of the red sub-pixel, an aperture ratio GO of the green sub-pixel and an aperture ratio BO of the blue sub-pixel satisfy: RO:GO: BO≈1:1.5:2.

According to one aspect of the present disclosure, a display panel is provided, including the pixel array as described in any of the above embodiments.

According to one aspect of the present disclosure, a metal mask for making the pixel array according to any of the above embodiments is provided. The metal mask includes a red light evaporation opening corresponding to the red sub-pixel, a green light evaporation opening corresponding to the green sub-pixel, and a blue light evaporation opening corresponding to the blue sub-pixel.

In some embodiments, when the metal mask is aligned with the pixel array, a spacing Rr between the aligned red sub-pixel and red light evaporation opening, a spacing Gg between the green sub-pixel and green light evaporation opening, and a spacing Bb between the aligned blue sub-pixel and blue light evaporation opening satisfy: Rr>Gg≈Bb.

In some embodiments, the spacing Rr further satisfies: $10.5 \ \mu m \leq Rr \leq 15.5 \ \mu m$. The spacing Gg further satisfies: $8.5 \ \mu m \leq Gg \leq 13.5 \ \mu m$. The spacing Bb further satisfies: $8.5 \ \mu m \leq Bb \leq 13.5 \ \mu m$.

In some embodiments, in an corresponding alignment structure of each of the pixel units, a spacing rG between the red light evaporation opening and the green sub-pixel satisfies: $8.5 \ \mu m \leq rG \leq 13.5 \ \mu m$; a spacing bG between the blue light evaporation opening and the green sub-pixel satisfies: $8.5 \ \mu m \leq bG \leq 13.5 \ \mu m$; a spacing gB between the green light evaporation opening and the blue sub-pixel satisfies: $8.5 \ \mu m \leq gB \leq 13.5 \ \mu m$; and a spacing gR between the green light evaporation opening and the red sub-pixel satisfies: $10.5 \ \mu m \leq gR \leq 15.5 \ \mu m$.

The beneficial effects of the present disclosure compared to the related art include at least the following.

In the present disclosure, through the layout and arrangement of the red, green and blue sub-pixels, when making the pixel array, the spacing between the red sub-pixel and the red light evaporation opening of the metal mask increases, so as to prolong the service life of the metal mask. At the same time, the distances between the red light evaporation opening and the sub-pixels with other colors are maintained to achieve higher process margin, reduce the process difficulty and improve the qualification rate of product.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. Obviously, the accompanying drawings described below are only some embodiments of the present disclosure. For those skilled in the art, other accompanying drawings can be obtained according to these accompanying drawings without paying creative labor.

DETAILED DESCRIPTION

Exemplary embodiments will now be described more fully with reference to the accompanying drawings. However, the exemplary embodiments can be implemented in a variety of forms, and should not be understood as limited to the embodiments set forth herein. On the contrary, by providing these embodiments, the present disclosure is comprehensive and complete, and the concept of the exemplary embodiments is conveyed to those skilled in the art.

The accompanying drawings are only schematic diagrams of the present disclosure and are not necessarily drawn to scale. The same reference number in the accompanying drawings denotes the same or similar parts, and therefore repeated description thereof will be omitted. The words "first", "second" and similar words used in the specific description do not indicate any order, quantity or importance, but are only used to distinguish different components from each other. It should be noted that the embodiments and features in different embodiments of the present disclosure can be combined with each other if there is no conflict.

Figure 1:
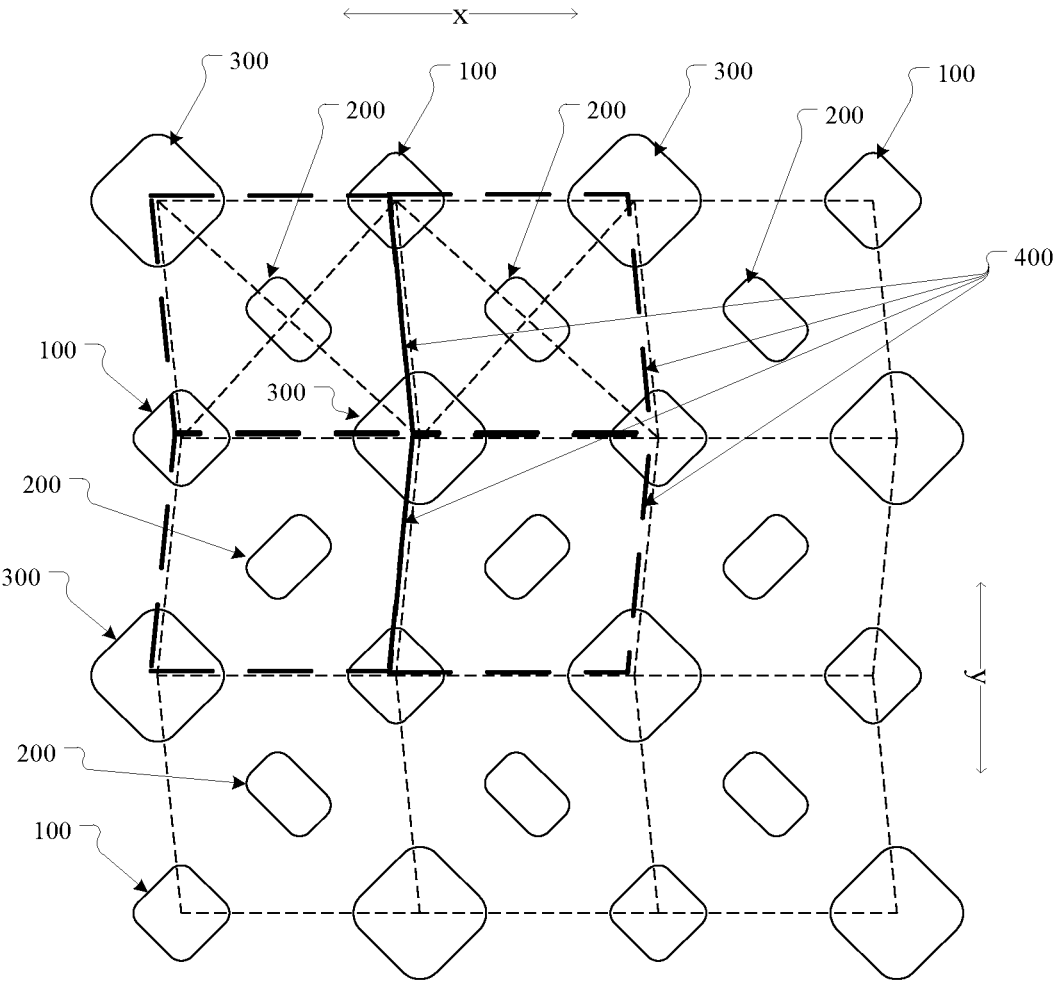
FIG. 1 shows a schematic diagram of an arrangement of a pixel array in an embodiment of the present disclosure.

FIG. 1 shows an arrangement structure of a pixel array in an embodiment of the present disclosure. FIG. 1 shows the arrangement structure of part of the sub-pixels in the pixel array, and number of the sub-pixels thereof should not be used as a limitation of the present disclosure.

With reference to FIG. 1, in one embodiment, the pixel array includes red sub-pixels 100, green sub-pixels 200, and blue sub-pixels 300 arranged in multiple rows and multiple columns.

Along a row direction "x", the red sub-pixels 100 and the blue sub-pixels 300 are alternately arranged to form a first type of pixel row (i.e., an odd row in FIG. 1), the green sub-pixels 200 are arranged to form a second type of pixel row (i.e., an even row in FIG. 1), and the first type of pixel row and the second type of pixel row are alternately arranged along a column direction "y".

Along the column direction "y", the red sub-pixels 100 and the blue sub-pixels 300 are alternately arranged to form a first type of pixel column (i.e., an odd column in FIG. 1), the green sub-pixels 200 are arranged to form a second type of pixel column (i.e., an even column in FIG. 1), and the first type of pixel column and the second type of pixel column are alternately arranged along the row direction "x".

The pixel array includes a plurality of pixel units 400 (in FIG. 1, each parallelogram marked by a dotted line corresponds to one pixel unit 400). Each pixel unit 400 is composed of two red sub-pixels 100 and two blue sub-pixels 300 distributed in two adjacent first type of pixel rows and two adjacent first type of pixel columns, and one green sub-pixel 200 located between the two adjacent first type of pixel rows and the two adjacent first type of pixel columns. For example, the pixel unit 400 in the upper left corner of FIG. 1 is composed of two red sub-pixels 100 and two blue sub-pixels 300 distributed in two adjacent odd rows (the first row and the third row) and two adjacent odd columns (the first column and the third column), and one green sub-pixel

200 located between the two adjacent odd rows and the two adjacent odd columns (i.e., between the first row and the third row, and between the first column and the third column; that is, at the second row and the second column).

In each pixel unit 400, connection lines of centers of the red sub-pixels 100 and the blue sub-pixels 300 in a same row and a same column form a parallelogram, the two red sub-pixels 100 and the two blue sub-pixels 300 are respectively located at diagonal positions of the parallelogram, and the center of the green sub-pixel 200 is located at an intersection position of the diagonal lines of the parallelogram.

Along the row direction "x", two adjacent parallelograms are in a translational relationship and share a column side (the column side refers to a side extending roughly along the column direction "y"). Along the column direction "y", two adjacent parallelograms are in a mirror-image relationship and share a row side (the row side refers to a side extending along the row direction "x", which is also a mirror-image symmetry axis of the two adjacent parallelograms).

According to the above pixel array, by means of the layout and arrangement of the red, green and blue sub-pixels, every two red sub-pixels 100, two blue sub-pixels 300 and one green sub-pixel 200 form one pixel unit 400, each pixel unit 400 forms a parallelogram, and the center of the green sub-pixel 200 is located at an intersection position of diagonal lines of the parallelogram. The adjacent parallelograms have a translational relationship along the row direction "x" and share the column side, and the adjacent parallelograms mirror along the column direction "y" and share the row side, which can achieve standardized pixel arrangement and stable display effect, and is conducive to achieving a high resolution and a high aperture ratio of pixel. At the same time, it is convenient to increase the spacing between the red sub-pixel 100 and the red light evaporation opening of the metal mask when making the metal mask corresponding to the pixel array, so as to lengthen the service life of the metal mask, and a distance between the red light evaporation opening and the sub-pixels with other colors (the green sub-pixel 200 and the blue sub-pixel 300) can be maintained, so as to achieve a higher process margin, reduce a process difficulty and improve a qualified rate of the pixel array.

In one embodiment, the green sub-pixel 200 has a long side and a short side. In each pixel unit 400, the short side of the green sub-pixel 200 faces an acute angle of the parallelogram, and the long side of the green sub-pixel 200 faces an obtuse angle of the parallelogram.

By means of the short side of the green sub-pixel 200 facing the acute angle of the parallelogram and the long side facing the obtuse angle of the parallelogram, it is beneficial to maintain the spacing between the green sub-pixel 200 and the sub-pixels with other colors in each pixel unit 400, so as to increase the spacing between the red sub-pixel 100 and the red light evaporation opening of the metal mask while maintaining the distance between the red light evaporation opening and the sub-pixels with other colors (especially the green sub-pixel 200) when making the pixel array.

In addition, between the red light evaporation opening and the blue sub-pixel 300, since the red sub-pixel 100 and the blue sub-pixel 300 are distributed at top corners of the parallelogram, appropriate spacing can be maintained.

In one embodiment, in each pixel unit 400, the red sub-pixel 100 located at a position of the obtuse angle of the parallelogram is opposite to the long side of the green sub-pixel 200, and the red sub-pixel 100 located at a position of the acute angle of the parallelogram is opposite to the short side of the green sub-pixel 200. Thus, it can be ensured that no matter whether the red sub-pixel 100 is located at the obtuse angle or the acute angle of the parallelogram, the red sub-pixel can maintain appropriate spacing with the green sub-pixel 200, so as to increase the spacing between the red sub-pixel 100 and the red light evaporation opening while maintaining the distance between the red light evaporation opening and the green sub-pixel 200 when making the pixel array.

Figure 2:
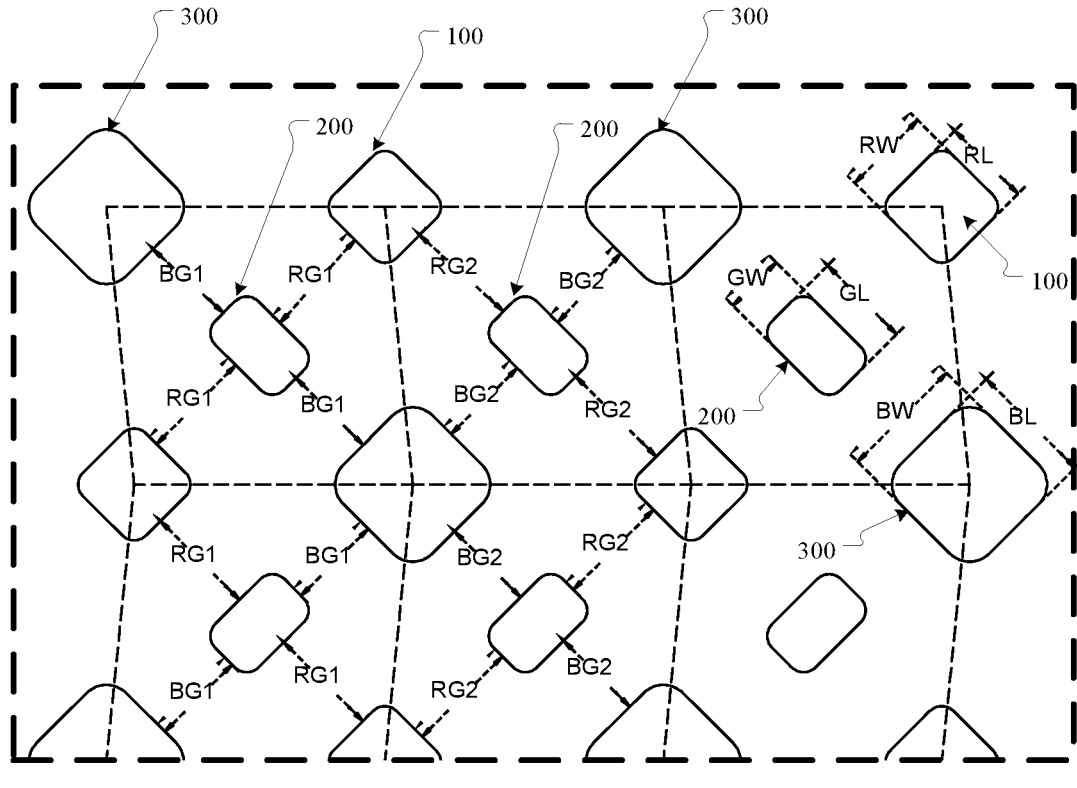
FIG. 2 shows a schematic diagram of a size of a local area of the pixel array in an embodiment of the present disclosure.

FIG. 2 shows a size of a local area of the pixel array in an embodiment of the present disclosure. With reference to FIG. 1 and FIG. 2, in one embodiment, a size of the blue sub-pixel 300 is larger than a size of the red sub-pixel 100. In each pixel unit 400, a distance RG1 between the red sub-pixel 100 and the long side of the green sub-pixel 200, a distance RG2 between the red sub-pixel 100 and the short side of the green sub-pixel 200, a distance BG1 between the blue sub-pixel 300 and the short side of the green sub-pixel 200, and a distance BG2 between the blue sub-pixel 300 and the long side of the green sub-pixel 200 satisfy: $RG1{\approx}RG2{>}BG1{\approx}BG2$.

By means of making the spacing between the red sub-pixel and the green sub-pixel greater than the spacing between the blue sub-pixel and the green sub-pixel, the distance between red sub-pixels 100 and green sub-pixels 200 is sufficient to ensure that when the metal mask is used to evaporate the pixel array, while increasing the spacing between the red sub-pixel 100 and the red light evaporation opening of the metal mask, the distance between the red light evaporation opening and the green sub-pixel 200 can be maintained, so as to achieve a higher process margin, reduce a process difficulty and improve a qualified rate of the pixel array.

Further, in one embodiment, the distance RG1 and the distance RG2 further satisfy: $20\ \mu m{\le}RG1{\approx}RG2{\le}30\ \mu m$. For example, RG1 and RG2 are both 24.5 μm, but not limited thereto. The distance BG1 and the distance BG2 further satisfy: $18\ \mu m{\le}BG1{\approx}BG2{\le}28\ \mu m$. For example, BG1 and BG2 are both 22.5 μm, but not limited thereto.

In one embodiment, the shape of the green sub-pixel 200 is a rounded rectangle, the shapes of the red sub-pixel 100 and the blue sub-pixel 300 are rounded squares, but not limited thereto. The red, green and blue sub-pixels may also be designed into other shapes as required. A ratio GL/GW of the long side to the short side of the green sub-pixel 200 satisfies: $1.25{\le}GL/GW{\le}1.85$, for example, $GL/GW{=}1.55$, but not limited thereto. A ratio RL:RW of two adjacent sides of the red sub-pixel 100 satisfies: $RL{:}RW{\approx}1{:}1$. A ratio BL:BW of two adjacent sides of the blue sub-pixel 300 satisfies: $BL{:}BW{\approx}1{:}1$.

Figure 3:
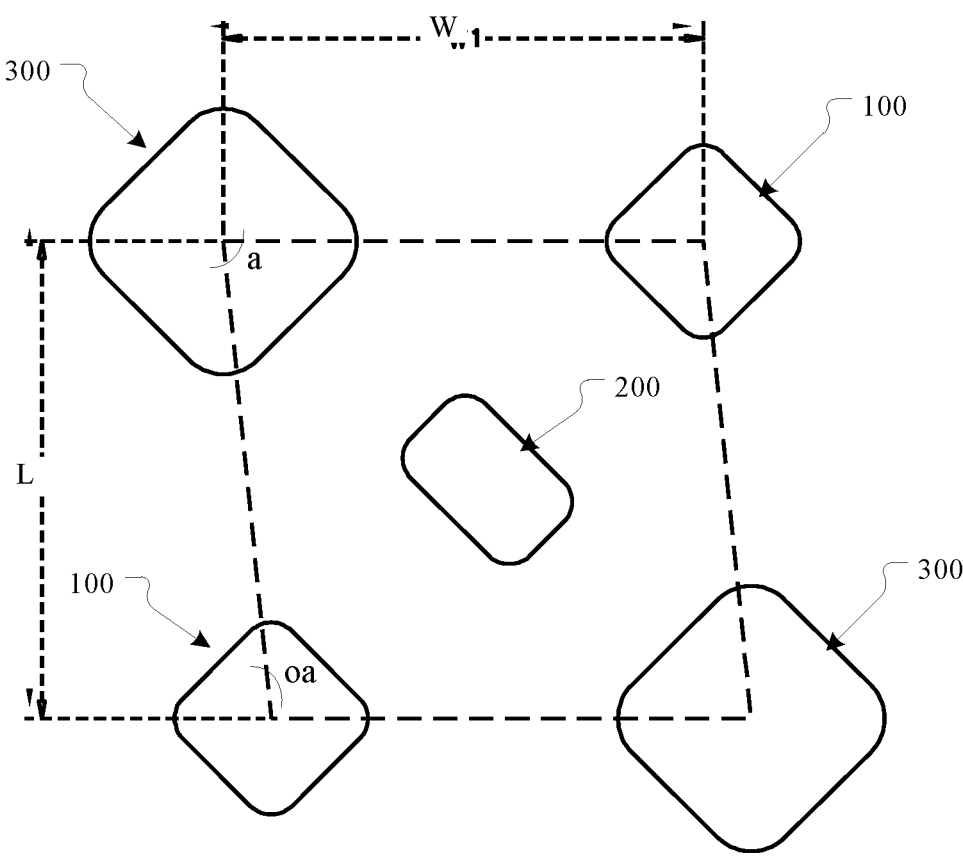
FIG. 3 shows a schematic diagram of a size of a single pixel unit of the pixel array in an embodiment of the present disclosure.

FIG. 3 shows a size of a single pixel unit of the pixel array in an embodiment of the present disclosure. With reference to FIG. 1 and FIG. 3, in one embodiment, the acute angle a of the parallelogram satisfies: $80°{\le}a{<}90°$, and the obtuse angle oa of the parallelogram satisfies: $90°{<}oa{\le}100°$. For example, the acute angle a is 84°, and the obtuse angle og is 96°, but they are not limited thereto.

In one embodiment, a width W of the parallelogram along the row direction "x" is equal to a height L of the parallelogram along the column direction "y", so as to ensure that the spacing between two adjacent sub-pixels in the same row and the same column is the same, so that the arrangement of pixels is standardized and the display effect is stable, which is beneficial to achieve high resolution and high aperture ratio of pixel.

In addition, in one embodiment, an aperture ratio (set as RO) of the red sub-pixel 100, an aperture ratio (set as GO) of the green sub-pixel 200 and an aperture ratio (set as BO)

of the blue sub-pixel 300 satisfy: RO:GO:BO≈1:1.5:2. The aperture ratios of the red, green and blue sub-pixels are based on a luminescence lifetime of the materials of the pixels of three colors. Generally, the luminescence lifetime of the material of the blue pixel<the luminescence lifetime of the material of the green pixel<the luminescence lifetime of the material of the red pixel, therefore, in order to make the brightness attenuation rate of the red, green and blue sub-pixels as consistent as possible, RO:GO:BO is approximately set to 1:1.5:2.

According to the pixel array of the present disclosure, by means of the layout and arrangement of the red, green and blue sub-pixels, the spacing between the red sub-pixel 100 and the red light evaporation opening of the metal mask when making the pixel array is increased, so as to lengthen the service life of the metal mask. At the same time, the distance between the red light evaporation opening and the sub-pixels with other colors (the green sub-pixel 200 and the blue sub-pixel 300) is maintained to achieve a higher process margin, reduce a process difficulty and improve a qualified rate of pixel array.

An embodiment of the present disclosure further provides a display panel, which includes the pixel array described in any of the above embodiments. In particular, the display panel may be an AMOLED display panel. The features and principles of the pixel array described in any of the above embodiments can be applied to the display panel of the present embodiment, and the same features and principles will not be repeatedly described.

According to the display panel of the present disclosure, by means of the layout and arrangement of the red, green and blue sub-pixels, the spacing between the red sub-pixel 100 and the red light evaporation opening of the metal mask when making the pixel array is increased, so as to lengthen the service life of the metal mask. At the same time, the distance between the red light evaporation opening and the sub-pixels with other colors (the green sub-pixel 200 and the blue sub-pixel 300) is maintained to achieve a higher process margin, reduce a process difficulty and improve a qualification rate of the display panel.

An embodiment of the present disclosure further provides a metal mask, which is used to make the pixel array described in any of the above embodiments. The features and principles of the pixel array described in any of the above embodiments can be applied to the metal mask of the present embodiment, and the same features and principles will not be repeatedly described.

Figure 4:
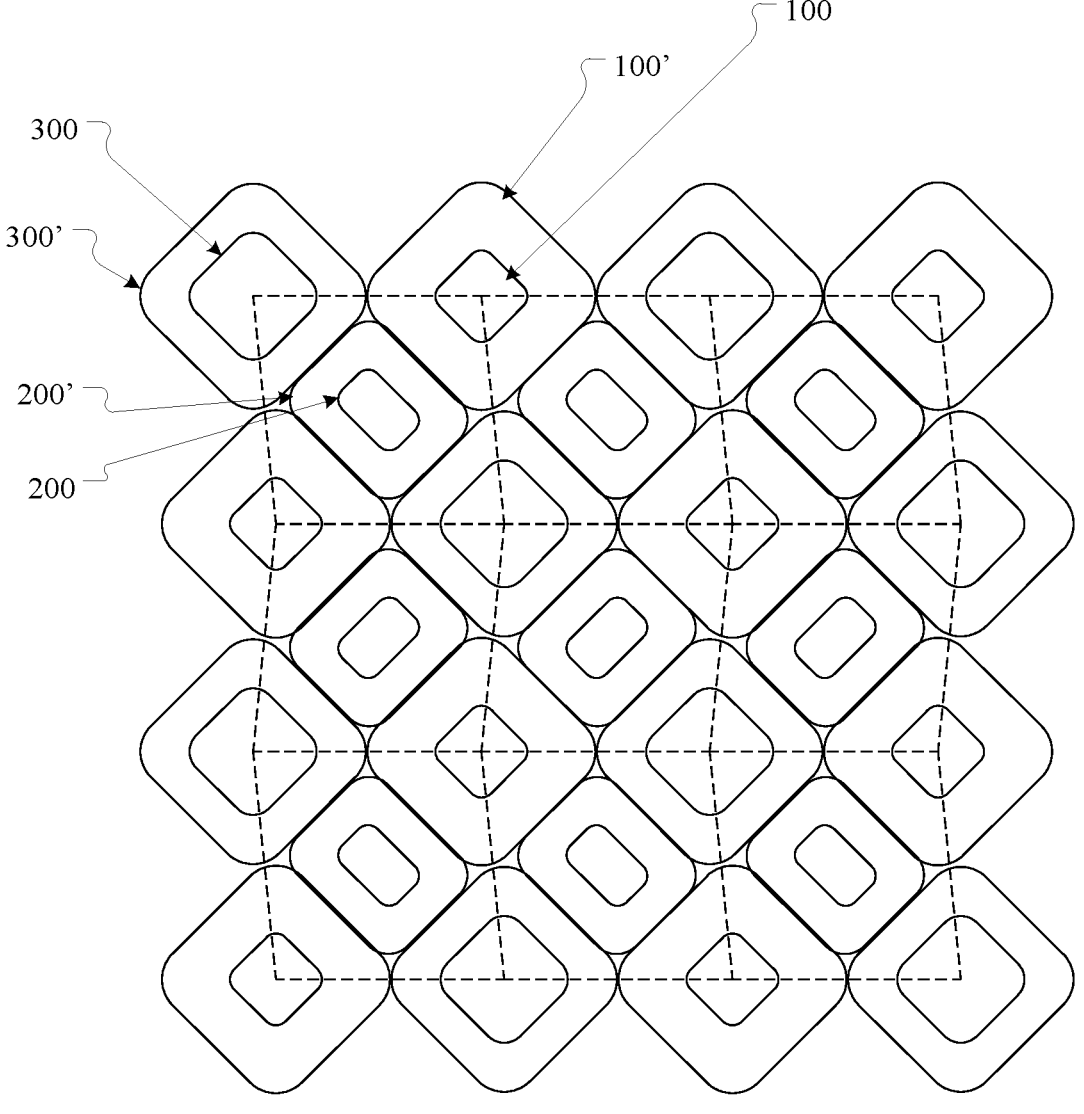
FIG. 4 shows a schematic diagram of an alignment of a metal mask with the pixel array in an embodiment of the present disclosure.
Figure 5:
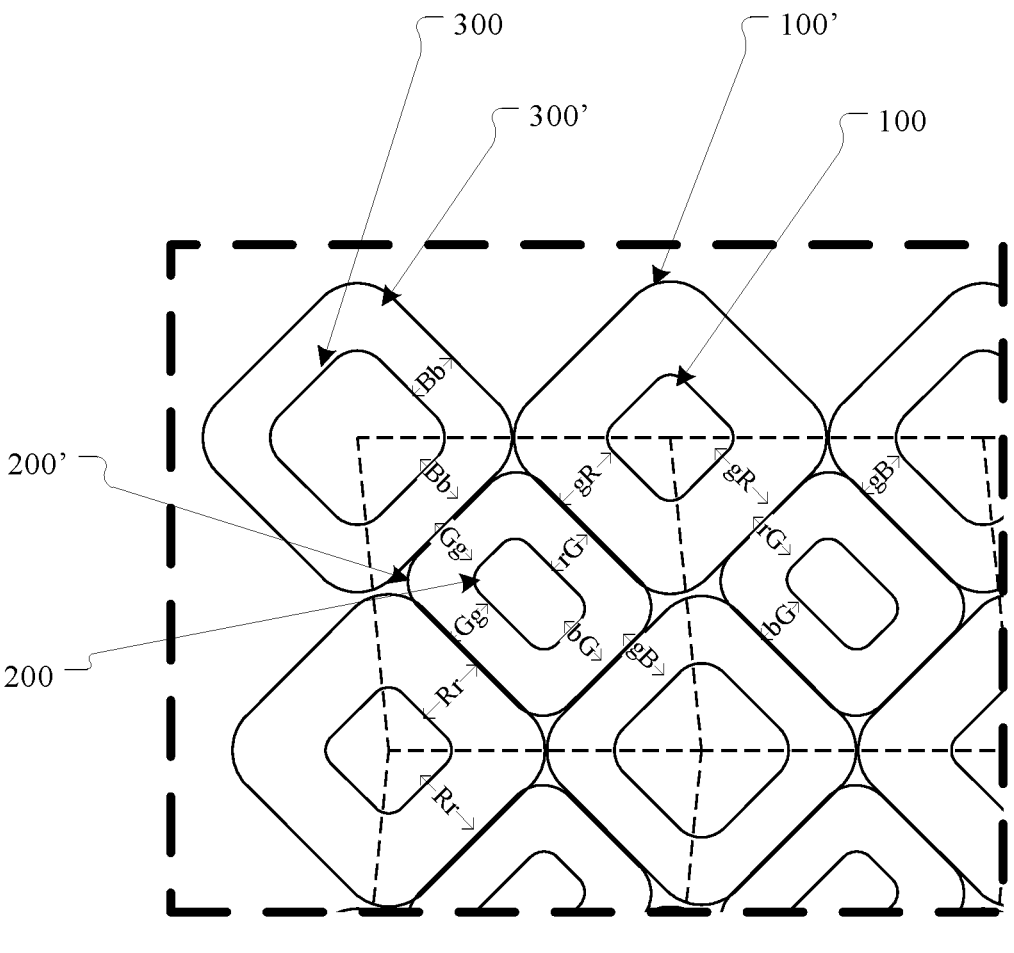
FIG. 5 shows a schematic diagram of a size of a local area in an alignment structure of the metal mask with the pixel array in an embodiment of the present disclosure.

FIG. 4 shows an alignment structure of the metal mask and the pixel array in an embodiment of the present disclosure, and FIG. 5 shows a size of a local area in the alignment structure of the metal mask and the pixel array. With reference to FIG. 1, FIG. 4 and FIG. 5, the metal mask includes a red light evaporation opening 100' corresponding to the red sub-pixel 100, a green light evaporation opening 200' corresponding to the green sub-pixel 200, and a blue light evaporation opening 300' corresponding to the blue sub-pixel 300.

In one embodiment, when the metal mask is aligned with the pixel array, spacing Rr between the aligned red sub-pixel 100 and red light evaporation opening 100', spacing Gg between the aligned green sub-pixel 200 and green light evaporation opening 200', and spacing Bb between the aligned blue sub-pixel 300 and blue light evaporation opening 300' satisfy: Rr>Gg≈Bb. Thus, the distance between the red sub-pixel 100 and the red light evaporation opening 100' can be increased to lengthen the service life of the metal mask.

The spacing Rr may specifically satisfy: 10.5 μm≤Rr≤15.5 μm, for example, Rr=13.3 μm, but not limited thereto. The spacing Gg may specifically satisfy: 8.5 μm≤Gg≤13.5 μm, for example, Gg=11.2 μm, but not limited thereto. The spacing Bb may specifically satisfy: 8.5 μm≤Bb≤13.5 μm, for example, Bb=11.2 μm, but not limited thereto.

Further, in one embodiment, in an alignment structure corresponding to each pixel unit 400: spacing rG between the red light evaporation opening 100' and green sub-pixel 200 satisfies: 8.5 μm≤rG≤13.5 μm (e.g., rG=11.2 μm, but not limited thereto); spacing bG between the blue light evaporation opening 300' and green sub-pixel 200 satisfies: 8.5 μm≤bG≤13.5 μm (e.g., bG=11.2 μm, but not limited thereto); spacing gB between the green light evaporation opening 200' and blue sub-pixel 300 satisfies: 8.5 μm≤gB≤13.5 μm (e.g., gB=11.2 μm, but not limited thereto); spacing gR between the green light evaporation opening 200' and red sub-pixel 100 satisfies: 10.5 μm≤gR≤15.5 μm (e.g., gR=13.3 μm, but not limited thereto).

By means of the design of the spacing rG, the spacing bG, the spacing gB and the spacing gR, on the basis of increasing the distance between the red sub-pixel 100 and the red light evaporation opening 100', the spacing between the red light evaporation opening 100' and the sub-pixels with other colors (the green sub-pixel 200 and the blue sub-pixel 300) is maintained, so as to prolong the service life of the metal mask while maintaining the process margin of alignment, and improving the qualified rate of evaporated products.

To sum up, according to the pixel array, the display panel and the metal mask of the present disclosure, by means of the layout and arrangement of the red, green and blue sub-pixels, the spacing between the red sub-pixel and the red light evaporation opening of the metal mask when making the pixel array is increased to lengthen the service life of the metal mask. At the same time, the distance between the red light evaporation opening and sub-pixels with other colors is maintained to achieve a higher process margin, reduce a process difficulty and improve a qualification rate of the product.

The above content is a further detailed description of the present disclosure in combination with specific embodiments, and it cannot be determined that the specific implementation of the present disclosure is limited to these descriptions. For a person of ordinary skill in the technical field to which the present disclosure belongs, a number of simple deductions or substitutions can be made without departing from the concept of the present disclosure, which should be regarded as belonging to the protection scope of the present disclosure.

What is claimed is:

1. A pixel array, comprising red sub-pixels, green sub-pixels and blue sub-pixels arranged in multiple rows and multiple columns, wherein:

along a row direction, the red sub-pixels and the blue sub-pixels are alternately arranged to form first type of pixel rows, the green sub-pixels are arranged to form second type of pixel rows, and the first type of pixel rows and the second type of pixel rows are alternately arranged along a column direction;

along the column direction, the red sub-pixels and the blue sub-pixels are alternately arranged to form first type of pixel columns, the green sub-pixels are arranged to form second type of pixel columns, and the first type of pixel columns and the second type of pixel columns are alternately arranged along the row direction;

the pixel array comprises a plurality of pixel units, each of the pixel units is composed of two red sub-pixels and two blue sub-pixels distributed in two adjacent first type of pixel rows and two adjacent first type of pixel columns, and a green sub-pixel located between the two adjacent first type of pixel rows and the two adjacent first type of pixel columns;

in each of the pixel units, connection lines of centers of the red sub-pixels and the blue sub-pixels in a same row and a same column form a parallelogram, the two red sub-pixels and the two blue sub-pixels are respectively located at diagonal positions of the parallelogram, and a center of the green sub-pixel is located at an intersection position of diagonal lines of the parallelogram;

along the row direction, two adjacent parallelograms are in a translational relationship and share a column side; and along the column direction, two adjacent parallelograms are in a mirror-image relationship and share a row side;

wherein, a size of the blue sub-pixel is larger than a size of the red sub-pixel; and in each of the pixel units, a distance RG1 between the red sub-pixel and the long side of the green sub-pixel, a distance RG2 between the red sub-pixel and the short side of the green sub-pixel, a distance BG1 between the blue sub-pixel and the short side of the green sub-pixel, and a distance BG2 between the blue sub-pixel and the long side of the green sub-pixel satisfy:

$$RG1 \approx RG2 > BG1 \approx BG2.$$

2. The pixel array according to claim 1, wherein, the green sub-pixel has a long side and a short side; and in each of the pixel units, the short side of the green sub-pixel faces an acute angle of the parallelogram, and the long side of the green sub-pixel faces an obtuse angle of the parallelogram.

3. The pixel array according to claim 2, wherein, in each of the pixel units, the red sub-pixel located at a position of the obtuse angle of the parallelogram is opposite to the long side of the green sub-pixel, and the red sub-pixel located at a position of the acute angle of the parallelogram is opposite to the short side of the green sub-pixel.

4. The pixel array according to claim 1, wherein, the distance RG1 and the distance RG2 further satisfy: 20 μm≤RG1≈RG2≤30 μm; and the distance BG1 and the distance BG2 further satisfy: 18 μm≤BG1≈BG2≤28 μm.

5. The pixel array according to claim 2, wherein, a ratio GL/GW of the long side to the short side of the green sub-pixel satisfies: 1.25≤GL/GW≤1.85.

6. The pixel array according to claim 1, wherein, an acute angle a of the parallelogram satisfies: 80°≤a<90°; and an obtuse angle oa of the parallelogram satisfies: 90°<oa≤100°.

7. The pixel array according to claim 1, wherein, a width of the parallelogram along the row direction is equal to a height of the parallelogram along the column direction.

8. The pixel array according to claim 1, wherein, an aperture ratio RO of the red sub-pixel, an aperture ratio GO of the green sub-pixel and an aperture ratio BO of the blue sub-pixel satisfy: RO:GO:BO≈1:1.5:2.

9. A display panel, wherein, the display panel comprises a pixel array, wherein the pixel array comprises red sub-pixels, green sub-pixels and blue sub-pixels arranged in multiple rows and multiple columns, wherein:

along a row direction, the red sub-pixels and the blue sub-pixels are alternately arranged to form first type of pixel rows, the green sub-pixels are arranged to form second type of pixel rows, and the first type of pixel rows and the second type of pixel rows are alternately arranged along a column direction;

along the column direction, the red sub-pixels and the blue sub-pixels are alternately arranged to form first type of pixel columns, the green sub-pixels are arranged to form second type of pixel columns, and the first type of pixel columns and the second type of pixel columns are alternately arranged along the row direction;

the pixel array comprises a plurality of pixel units, each of the pixel units is composed of two red sub-pixels and two blue sub-pixels distributed in two adjacent first type of pixel rows and two adjacent first type of pixel columns, and a green sub-pixel located between the two adjacent first type of pixel rows and the two adjacent first type of pixel columns;

in each of the pixel units, connection lines of centers of the red sub-pixels and the blue sub-pixels in a same row and a same column form a parallelogram, the two red sub-pixels and the two blue sub-pixels are respectively located at diagonal positions of the parallelogram, and a center of the green sub-pixel is located at an intersection position of diagonal lines of the parallelogram;

along the row direction, two adjacent parallelograms are in a translational relationship and share a column side; and along the column direction, two adjacent parallelograms are in a mirror-image relationship and share a row side;

wherein, a size of the blue sub-pixel is larger than a size of the red sub-pixel; and in each of the pixel units, a distance RG1 between the red sub-pixel and the long side of the green sub-pixel, a distance RG2 between the red sub-pixel and the short side of the green sub-pixel, a distance BG1 between the blue sub-pixel and the short side of the green sub-pixel, and a distance BG2 between the blue sub-pixel and the long side of the green sub-pixel satisfy:

$$RG1 \sim RG2 > BG1 \sim BG2.$$

10. A metal mask, wherein, the metal mask is used in a fabrication of a pixel array, wherein, the pixel array comprises red sub-pixels, green sub-pixels and blue sub-pixels arranged in multiple rows and multiple columns, wherein:

along a row direction, the red sub-pixels and the blue sub-pixels are alternately arranged to form first type of pixel rows, the green sub-pixels are arranged to form second type of pixel rows, and the first type of pixel rows and the second type of pixel rows are alternately arranged along a column direction;

along the column direction, the red sub-pixels and the blue sub-pixels are alternately arranged to form first type of pixel columns, the green sub-pixels are arranged to form second type of pixel columns, and the first type of pixel columns and the second type of pixel columns are alternately arranged along the row direction;

the pixel array comprises a plurality of pixel units, each of the pixel units is composed of two red sub-pixels and two blue sub-pixels distributed in two adjacent first type of pixel rows and two adjacent first type of pixel columns, and a green sub-pixel located between the two adjacent first type of pixel rows and the two adjacent first type of pixel columns;

in each of the pixel units, connection lines of centers of the red sub-pixels and the blue sub-pixels in a same row and a same column form a parallelogram, the two red sub-pixels and the two blue sub-pixels are respectively located at diagonal positions of the parallelogram, and a center of the green sub-pixel is located at an intersection position of diagonal lines of the parallelogram;

along the row direction, two adjacent parallelograms are in a translational relationship and share a column side; and along the column direction, two adjacent parallelograms are in a mirror-image relationship and share a row side;

wherein, a size of the blue sub-pixel is larger than a size of the red sub-pixel; and in each of the pixel units, a distance RG1 between the red sub-pixel and the long side of the green sub-pixel, a distance RG2 between the red sub-pixel and the short side of the green sub-pixel, a distance BG1 between the blue sub-pixel and the short side of the green sub-pixel, and a distance BG2 between the blue sub-pixel and the long side of the green sub-pixel satisfy:

$$RG1{\approx}RG2{>}BG1{\approx}BG2,$$

wherein, the metal mask comprises a red light evaporation opening corresponding to the red sub-pixel, a green light evaporation opening corresponding to the green sub-pixel, and a blue light evaporation opening corresponding to the blue sub-pixel.

11. The metal mask according to claim 10, wherein, in response to that the metal mask is aligned with the pixel array, a spacing Rr between the aligned red sub-pixel and red light evaporation opening, a spacing Gg between the aligned green sub-pixel and green light evaporation opening, and a spacing Bb between the aligned blue sub-pixel and blue light evaporation opening satisfy: $Rr{>}Gg{\approx}Bb$.

12. The metal mask according to claim 11, wherein, the spacing Rr further satisfies: 10.5 μm≤Rr≤15.5 μm;

the spacing Gg further satisfies: 8.5 μm≤Gg≤13.5 μm;

the spacing Bb further satisfies: 8.5 μm≤Bb≤13.5 μm.

13. The metal mask according to claim 12, wherein, in an alignment structure corresponding to each of the pixel units:

a spacing rG between the red light evaporation opening and the green sub-pixel satisfies: 8.5 μm≤rG≤13.5 μm;

a spacing bG between the blue light evaporation opening and the green sub-pixel satisfies: 8.5 μm≤bG≤13.5 μm;

a spacing gB between the green light evaporation opening and the blue sub-pixel satisfies: 8.5 μm≤gB≤13.5 μm;

a spacing gR between the green light evaporation opening and the red sub-pixel satisfies: 10.5 μm≤gR≤15.5 μm.

14. The display panel according to claim 9, wherein, the green sub-pixel has a long side and a short side; and in each of the pixel units, the short side of the green sub-pixel faces an acute angle of the parallelogram, and the long side of the green sub-pixel faces an obtuse angle of the parallelogram.

15. The display panel according to claim 14, wherein, in each of the pixel units, the red sub-pixel located at a position of the obtuse angle of the parallelogram is opposite to the long side of the green sub-pixel, and the red sub-pixel located at a position of the acute angle of the parallelogram is opposite to the short side of the green sub-pixel.

16. The display panel according to claim 9, wherein, the distance RG1 and the distance RG2 further satisfy: 20 μm≤RG1≈RG2≤30 μm; and the distance BG1 and the distance BG2 further satisfy: 18 μm≤BG1≈BG2≤28 μm.

17. The display panel according to claim 14, wherein, a ratio GL/GW of the long side to the short side of the green sub-pixel satisfies: 1.25≤GL/GW≤1.85.

18. The display panel according to claim 9, wherein, an acute angle a of the parallelogram satisfies: 80°≤a<90°; and an obtuse angle oa of the parallelogram satisfies: 90°<oa≤100°.

* * * * *